US005783479A

United States Patent [19]
Lin et al.

[11] Patent Number: 5,783,479
[45] Date of Patent: Jul. 21, 1998

[54] STRUCTURE AND METHOD FOR MANUFACTURING IMPROVED FETS HAVING T-SHAPED GATES

[75] Inventors: Horng-Chih Lin; Tiao-Yuan Huang, both of Hsinchu, Taiwan

[73] Assignee: National Science Council, Taipei, Taiwan

[21] Appl. No.: 880,471

[22] Filed: Jun. 23, 1997

[51] Int. Cl.⁶ .................. H01L 21/3205; H01L 21/4763
[52] U.S. Cl. .............................. 438/592; 438/595
[58] Field of Search .................... 438/182, 585, 438/592, 595

[56] References Cited

U.S. PATENT DOCUMENTS

| | | | |
|---|---|---|---|
| 4,818,715 | 4/1989 | Chao | 438/585 |
| 5,061,647 | 10/1991 | Roth et al. | 438/592 |
| 5,102,815 | 4/1992 | Sanchez | 438/592 |
| 5,110,411 | 5/1992 | Long | 438/592 |
| 5,147,814 | 9/1992 | Takeuchi | 438/592 |
| 5,275,960 | 1/1994 | Yamaguchi et al. | 438/585 |
| 5,302,536 | 4/1994 | Josquin | 438/585 |
| 5,334,545 | 8/1994 | Caviglia | 438/592 |
| 5,545,578 | 8/1996 | Park et al. | 438/592 |
| 5,599,725 | 2/1997 | Dorleans et al. | 438/592 |

*Primary Examiner*—John Niebling
*Assistant Examiner*—Richard A. Booth
*Attorney, Agent, or Firm*—Townsend and Townsend and Crew LLP

[57] ABSTRACT

A structure and method for manufacturing improved FETs having T-shaped gates can reduce the parasitic resistance of the gate and source/drain of an FET. In the improved FETs having T-shaped gates formed according to the invention, since a buffer layer under spacers comprises a gate oxide layer and a thicker first dielectric layer, there is no stress problem as in the prior art. Furthermore, since the polysilicon gate is lower in height than the spacers, a bridge effect can be prevented. Meanwhile, since a T-shaped conductive layer is formed to increase the equivalent width of the gate, thereby avoiding the narrow line-width effect.

9 Claims, 3 Drawing Sheets

STRUCTURE AND METHOD FOR MANUFACTURING IMPROVED FETS HAVING T-SHAPED GATES

BACKGROUND OF THE INVENTION

1. Field of the Invention

The invention relates to a structure and method for manufacturing improved FETs having T-shaped gates which can reduce the parasitic resistance between gate and source/drain and have the advantages of novelty, simplicity and practicability.

2. Description of the Related Art

As state of the semiconductor applications increasingly requires the deep micron process, the integration of circuit components devices has increased and overall size of such components has continued to shrink. However, the parasitic resistance of transistors affects the operating speed of devices. Currently, self-aligned metal silicide and selective tungsten depositing processes are used to decrease the parasitic resistance. Nevertheless, there are a number of limitations to these processes which will be described hereinafter.

When extremely thin conductive lines are formed by the self-aligned metal silicide process, the sheet resistance of the conductive lines rapidly increases with decreasing line width, in what is called a narrow line-width effect. Furthermore, in the self-aligned titanium silicide process, titanium silicide is formed by means of the interaction between titanium and silicon. That is, when performing an annealing process, the high-temperature can cause the silicon over-diffuse across spacers to react with titanium, thereby forming titanium silicide ($TiSi_2$) on the spacers. Therefore, gate and source/drain may be connected to each other, resulting in a short circuit. This is the so-called bridge effect. Moreover, since the sizes of devices and the width of the spacers are reduced, the distance between the gate and source/drain is shortened, thereby increasing the probability of the bridge effect.

A new selective tungsten depositing process was disclosed at an IEDM conference at NEC company in Japan in 1994. In this selective tungsten depositing process, silicon nitride spacers cooperating with a selective oxide etch process are used to avoid the bridge effect. However, since a buffer layer between silicon nitride spacers and a silicon substrate is extremely thin (about 1000 Å), the stress of the silicon nitride may affect the junction characteristics of source/drain. In addition, since the width of a tungsten line deposited on the gate is the same as that of a polysilicon line, a thicker tungsten layer on the extremely thin line is needed to significantly reduce the resistance.

SUMMARY OF THE INVENTION

In view of the above, the invention is to provide a structure and method for manufacturing improved FETs having T-shaped gates which not only decrease the parasitic resistance of gate, but also can efficiently eliminate the above-mentioned narrow line-width effect and bridge effect. Moreover, this method can be easily applied to general production lines.

For these purposes, the invention provides a method for manufacturing improved FETs with T-shaped gates. This method comprises the following steps: (a) First, a substrate on which transistors are already formed is provided, wherein each of the transistors includes a polysilicon gate, a thin oxide layer and extended source/drain regions; (b) a first dielectric layer having a thickness of 500~1,500 Å is formed on the substrate, wherein the first dielectric layer may be a TEOS layer, borosilicate glass (BSG), phosphosilicate glass (PSG), borophosphosilicate glass (BPSG), or the like; (c) source/drain regions are formed by use of an ion implanting process; (d) a second dielectric layer having a thickness of 500~1,500 Å is formed on the first dielectric layer, wherein the second dielectric layer is a silicon nitride layer; (e) spacers are formed by means of etching the second dielectric layer; (f) the tops of the polysilicon gates and source/drain regions are exposed by means of etching the first dielectric layer and thin oxide layer; (g) and a conductive layer is formed on the tops of the polysilicon gates and source/drain regions, wherein the conductive layer and polysilicon gates make up T-shaped gate conductive layers and the conductive layer can be metal (such as, titanium, cobalt, nickel, etc.) silicide formed by use of a self-aligned silicidation process, or a metal layer (such as, tungsten) formed by a selective depositing process.

The improved FETs having T-shaped gates formed according to the invention are characterized in having polysilicon gates and a conductive layer which compose T-shaped gate conductive layers, a second dielectric layer formed on the two sides of each T-shaped gate conductive layer and a first dielectric layer formed between each T-shaped gate conductive layer and second dielectric layer, wherein the gate oxide layer and first dielectric layer are located between the second dielectric layer and substrate.

In the improved FETs having T-shaped gates manufactured according to the invention, since a buffer layer under the second dielectric layer comprises the first dielectric layer having a thickness of 500~1,500 Å and gate oxide layer, there are no problems resulting from the stress as in the prior art. Furthermore, since the polysilicon gate is lower in height than the second dielectric layer, the bridge effect can be prevented. Meanwhile, since the T-shaped conductive gates are formed, the equivalent width of the gates is increased, thereby efficiently preventing the narrow line-width effect.

BRIEF DESCRIPTION OF THE DRAWINGS

The present invention will become more fully understood from the detailed description given hereinbelow and the accompanying drawings, which are provided for illustration of preferred embodiments only and should not be construed as limiting the scope of the present invention, and wherein.

DETAILED DESCRIPTION OF THE INVENTION

EMBODIMENT 1

A method for manufacturing improved FETs having T-shaped gates according to a first embodiment of the invention comprises the following steps:

Step 1

Figure 1A:
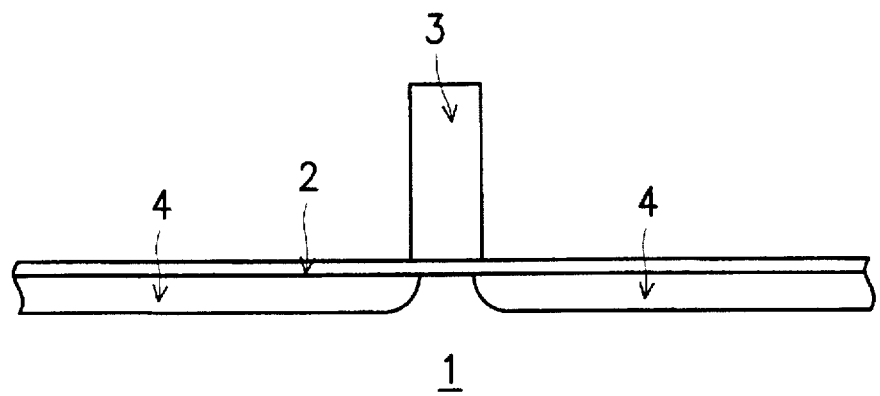
Figs. 1A~1F are cross-sectional views showing a method for manufacturing an improved FET having a T-shaped gate according to a first embodiment of the invention.

A substrate 1 on which a polysilicon gate 3, a thin oxide 2 and extended source/drain regions 4 are already formed is provided as shown in FIG. 1A.

Step 2

Figure 1B:
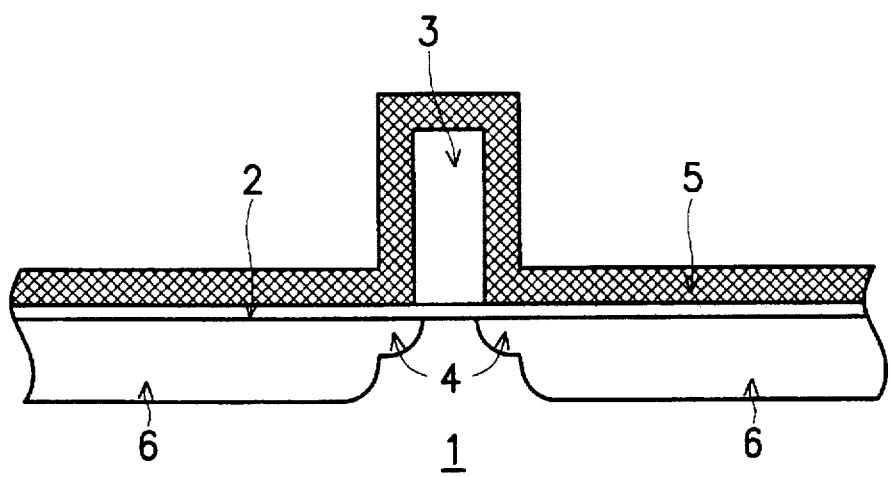

As shown in FIG. 1B, a first dielectric layer 5 is deposited over the substrate 1, then the substrate 1 is subjected to ion implantation to form source/drain regions 6, wherein the first dielectric layer 5 can be a TEOS layer, borosilicate glass (BSG), phosphosilicate glass (PSG) or borophosphosilicate glass (BPSG) having a thickness of 500~1,500 Å. In this embodiment, the first dielectric layer 5 is a TEOS layer.

Step 3

Figure 1C:
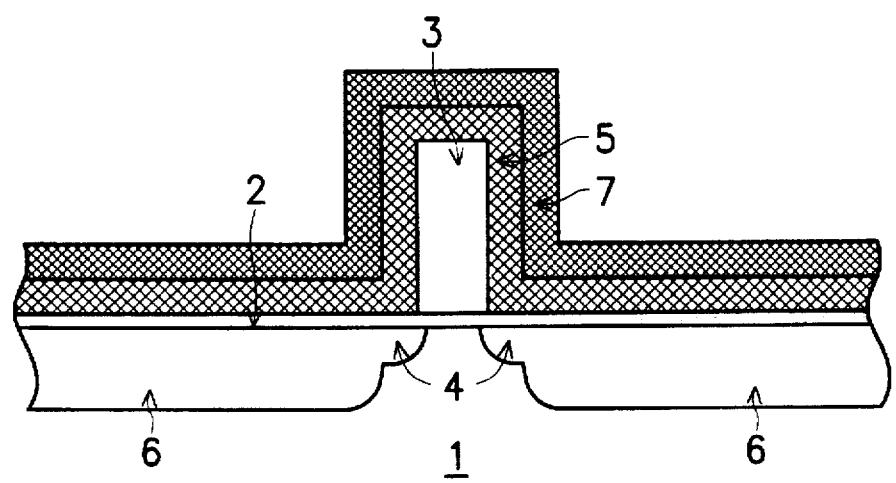

As shown in FIG. 1C, a second dielectric layer 7 is deposited on the first dielectric 5, wherein the second dielectric layer 7 is a silicon nitride layer having a thickness of 500~1,500 Å.

Step 4

Figure 1D:
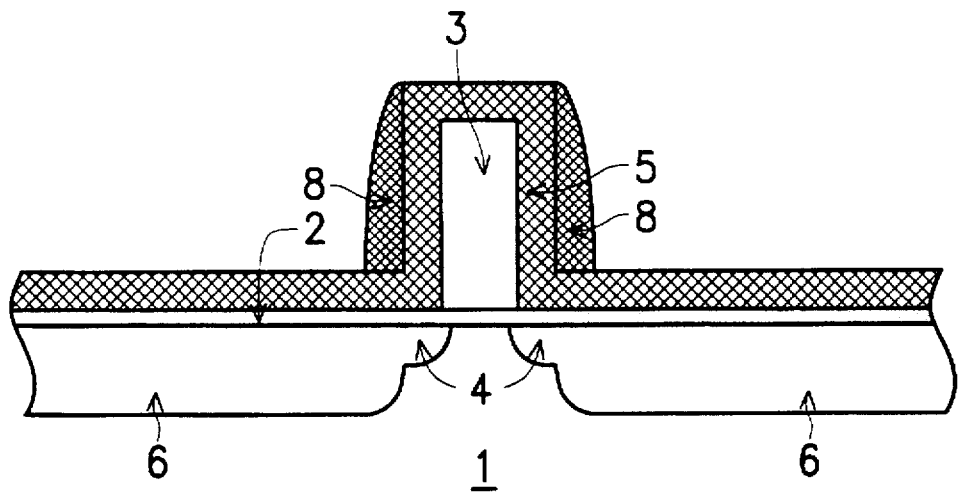

As shown in FIG. 1D, part of the second dielectric layer 7 is removed to form spacers 8 by use of a dry etching process with high selectivity to the second dielectric layer 7.

Step 5

Figure 1E:
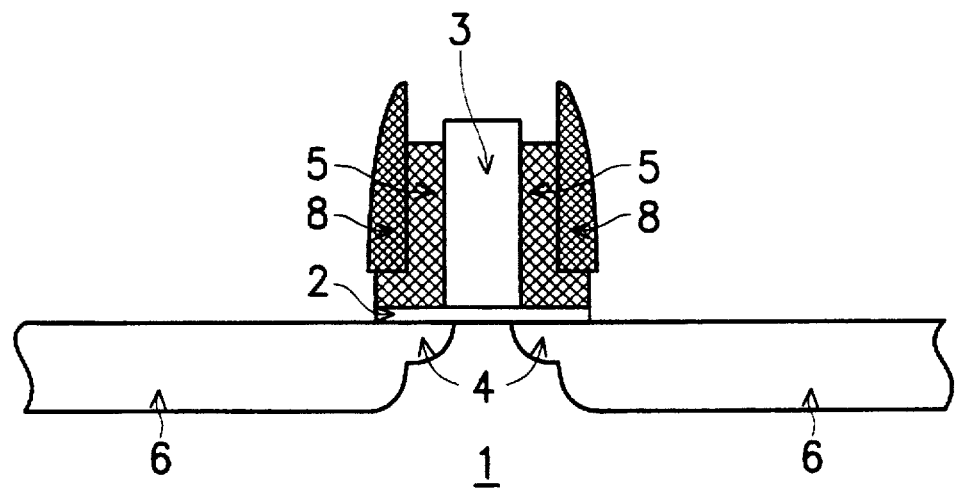

As shown in FIG. 1E, the first dielectric layer 5 and thin oxide layer 2 are etched by a dry or wet etching process to expose the top of the polysilicon gate 3 and source/drain 6. After that, the first dielectric layer 5 is located between the spacers 8 and polysilicon gate 3, and the thin oxide layer 2 and first dielectric layer 5 are positioned between the spacers 8 and extended source/drain regions 4.

Step 6

Figure 1F:
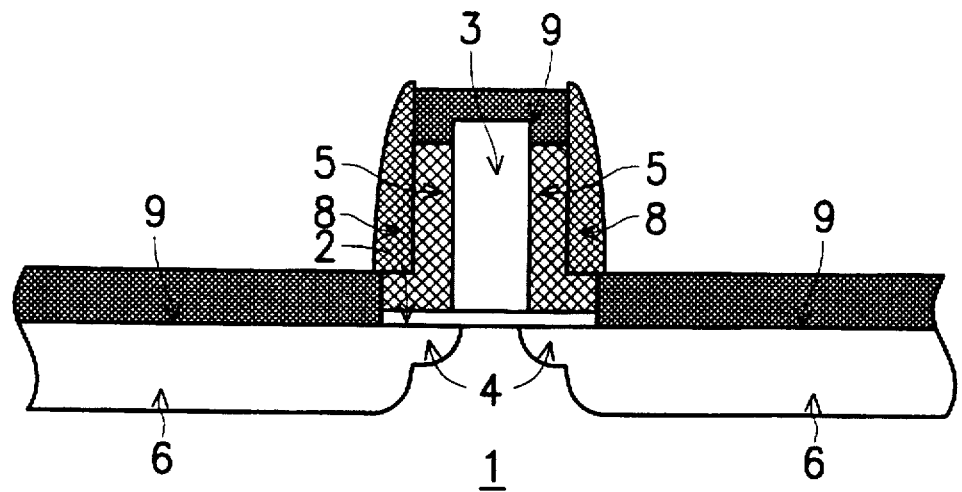

Finally, a conductive layer 9 is formed on the top of the polysilicon gate 3 and source/drain regions 6 by a selective tungsten depositing process as shown in Fig. 1F, wherein the conductive layer 9 and polysilicon gate 3 make up a T-shaped gate conductive layer, and the conductive layer 9 is a tungsten layer having a thickness of 500~,500 Å.

EMBODIMENT 2

Figure 1G:
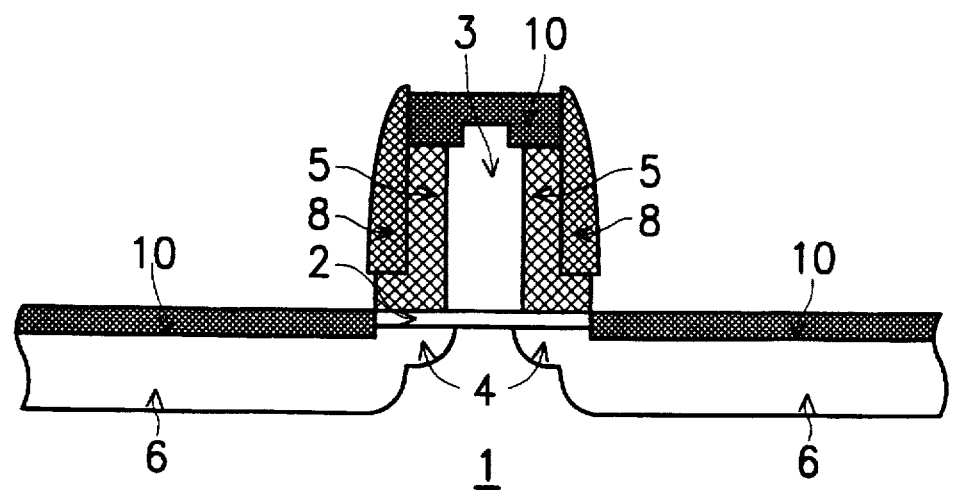
FIG. 1G is a cross-sectional view showing a completely manufactured FET having a T-shaped gate according to a second embodiment of the invention.

After completing step 5 as shown in FIG. 1E according to the first embodiment, a conductive layer 10 is formed on the top of the polysilicon gate 3 and source/drain regions 6 by use of a self-aligned metal silicide process, wherein the conductive layer 10 and polysilicon gate 3 constitute a T-shaped gate conductive layer and the used metal can be titanium, cobalt or nickel as shown in FIG. 1G.

Referring to Figs. 1F and 1G, the gate structure of the FETs having T-shaped gates formed according to the above-mentioned embodiments consists of the polysilicon gate 3, conductive layer (9 or 10), spacers 8 formed on the two sides of the T-shaped gate conductive layer, and first dielectric layer 5 formed between the T-shaped gate conducive layer and spacers 8, wherein the thin (gate) oxide layer 2 and first dielectric layer 5 are located between the spacers 8 and substrate 1.

In summary, in the improved FET having a T-shaped gate formed according to the invention, since a buffer layer under the spacers 8 comprises the first dielectric layer 5 having a thickness of 500~1,500 Å and gate oxide layer 2, there is no stress problem as in the prior art. Moreover, since the polysilicon gate 3 is lower in height than the spacers 8, the bridge effect can be prevented. Meanwhile, since the T-shaped conductive gate is formed to increase its equivalent width, the narrow line-width effect can also be prevented.

Although the invention has been disclosed in terms of a preferred embodiment, the disclosure is not intended to limit the invention. Those knowledgeable in the art can make modifications within the scope and spirit of the invention which is determined by the claims below.

What is claimed is:

1. A method for manufacturing improved FETs having T-shaped gates, comprising the steps of:

providing a substrate on which a polysilicon gate, a thin oxide layer and extended source/drain regions are already formed;

forming a first dielectric layer on said substrate;

forming source/drain regions by use of an ion implantation process;

forming a second dielectric layer on said first dielectric layer;

etching said second dielectric layer to form spacers;

etching said first dielectric layer and said thin oxide layer to expose the top of said polysilicon gate and said source/drain regions; and forming a conductive layer on the top of said polysilicon gate and said source/drain regions, wherein said conductive layer and said polysilicon gate make up a T-shaped gate conductive layer.

2. A method as claimed in claim 1, wherein said conductive layer is a tungsten layer having a thickness of 500~1,500 Å and is formed by use of a selective tungsten depositing process.

3. A method as claimed in claim 1, wherein said conductive layer is a metal silicide layer and is formed by use of a self-aligned metal silicide process.

4. A method as claimed in claim 3, wherein said metal silicide can be titanium silicide, cobalt silicide or nickel silicide.

5. A method as claimed in claim 1, wherein said first dielectric layer is a TEOS layer, a borosilicate glass (BSG), a phosphosilicate glass (PSG) or a borophosphosilicate glass (BPSG) having a thickness of 500~1,500 Å.

6. A method as claimed in claim 1, wherein said second dielectric layer is a silicon nitride layer having a thickness of 500~1,500 Å.

7. A method as claimed in claim 1, wherein said second dielectric layer is etched by use of a dry etching process.

8. A method as claimed in claim 1, said first dielectric layer is etched by a wet etching process having high selectivity to said second dielectric layer and said polysilicon gate.

9. A method as claimed in claim 1, wherein said first dielectric layer is etched by use of a dry etching process having high selectivity to said second dielectric layer and said polysilicon gate.

* * * * *